(12) United States Patent
Kawaguchi et al.

(10) Patent No.: US 7,514,777 B2
(45) Date of Patent: Apr. 7, 2009

(54) POWER SEMICONDUCTOR MODULE

(75) Inventors: Yasuto Kawaguchi, Fukuoka (JP); Yukimasa Hayashida, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/566,274

(22) Filed: Dec. 4, 2006

(65) Prior Publication Data

US 2008/0105896 A1     May 8, 2008

(30) Foreign Application Priority Data

Sep. 28, 2006   (JP) .............................. 2006-265178

(51) Int. Cl.
*H01L 23/34* (2006.01)
(52) U.S. Cl. ........................ 257/687; 257/678; 257/683; 257/E25.03
(58) Field of Classification Search ................. 257/706, 257/401, 687, 678, 683, 787, 788, 679, E25.03
See application file for complete search history.

(56) References Cited

U.S. PATENT DOCUMENTS

| 5,744,860 | A | 4/1998 | Bayerer | |
|---|---|---|---|---|
| 5,942,797 | A * | 8/1999 | Terasawa | 257/723 |
| 6,844,621 | B2 | 1/2005 | Morozumi et al. | |
| 2002/0043727 | A1* | 4/2002 | Wu | 257/786 |
| 2005/0146052 | A1* | 7/2005 | Sakamoto et al. | 257/780 |
| 2005/0199999 | A1* | 9/2005 | Shirasawa et al. | 257/706 |

FOREIGN PATENT DOCUMENTS

| DE | 23 47 049 A1 | 2/1975 |
|---|---|---|
| EP | 0 789 397 A2 | 8/1997 |
| JP | 10-214915 | 8/1998 |
| JP | 2002-76197 | 3/2002 |
| JP | 2005-32879 | 2/2005 |
| JP | 2005-286100 | 10/2005 |

* cited by examiner

*Primary Examiner*—Evan Pert
*Assistant Examiner*—Selim Ahmed
(74) *Attorney, Agent, or Firm*—Oblon, Spivak, McClelland, Maier & Neustadt, P.C.

(57) ABSTRACT

A power semiconductor module of the present invention comprises: a heat sink 1; a circuit substrate 2 mounted on the heat sink 1; a conductive pattern 10 provided on the circuit substrate 2; a low dielectric constant film 11 covering the conductive pattern 10; a case 7 provided on the heat sink 1 so as to enclose the circuit substrate 2; and a soft insulator 9 filling the space within the case 7. The low dielectric constant film 11 is preferably formed of silicon rubber, polyimide, or epoxy resin.

10 Claims, 3 Drawing Sheets

_US 7,514,777 B2_

POWER SEMICONDUCTOR MODULE

BACKGROUND OF THE INVENTION

1. Field of the Invention

The present invention relates to a power semiconductor module in which partial discharge is reduced to achieve a longer operating life.

2. Background Art

A conventional power semiconductor module, such as that proposed in Japanese Laid-Open Patent Publication No. 2002-76197, includes: a heat sink; a circuit substrate(s) mounted on the heat sink; a conductive pattern provided on the circuit substrate; a case provided on the heat sink so as to enclose the circuit substrate; a soft insulator filling the space within the case; and a solid insulator provided on the top surface of the circuit substrate such that it is in contact with the peripheral portion of the conductive pattern. The solid insulator is intended to enhance the insulation resistance and the withstand voltage of the module.

However, when the power semiconductor module is used at a high voltage, a partial discharge may occur from a floating potential portion within the module, resulting in insulation failure. It has been found that drive circuit substrates having electrodes on both sides and having a complicated shape are especially susceptible to partial discharge.

SUMMARY OF THE INVENTION

The present invention has been devised to solve the above problem. It is, therefore, an object of the present invention to provide a power semiconductor module in which partial discharge is reduced to achieve a longer operating life.

According to one aspect of the present invention, a power semiconductor module of the present invention comprises: a heat sink; a circuit substrate mounted on the heat sink; a conductive pattern provided on the circuit substrate; a low dielectric constant film covering the conductive pattern; a case provided on the heat sink so as to enclose the circuit substrate; and a soft insulator filling the space within the case. The low dielectric constant film is preferably formed of silicon rubber, polyimide, or epoxy resin.

The present invention allows reduction of partial discharge within a power semiconductor module, resulting in an extended operating life.

Other and further objects, features and advantages of the invention will appear more fully from the following description.

DETAILED DESCRIPTION OF THE PREFERRED EMBODIMENTS

First Embodiment

Figure 1:
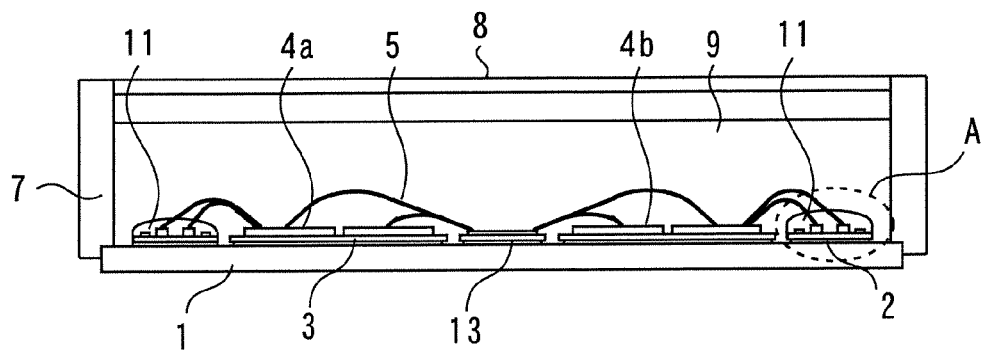
FIG. 1 is a cross-sectional view of a power semiconductor module according to a first embodiment of the present invention.
Figure 2:
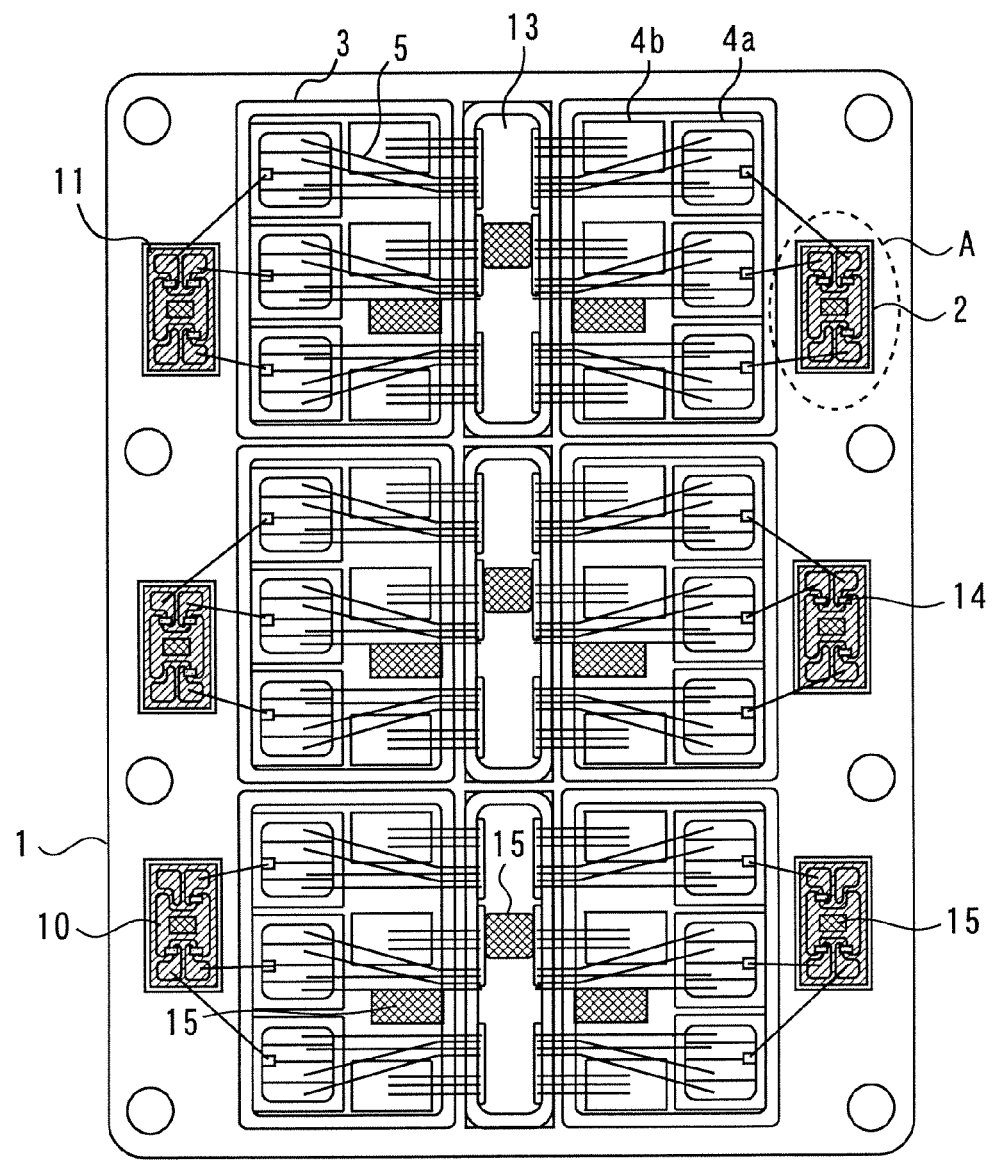
FIG. 2 is a top view of the power semiconductor module according to the first embodiment of the present invention.
Figure 3:
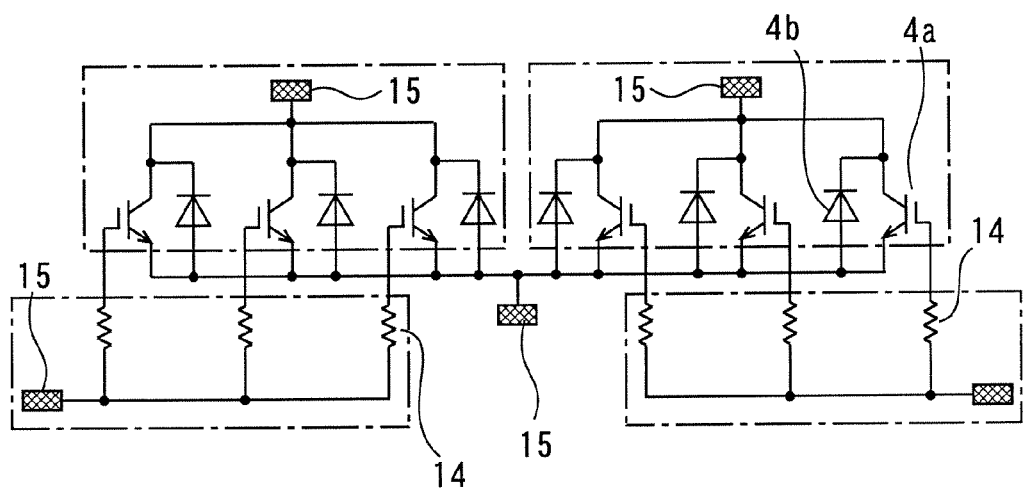
FIG. 3 shows an equivalent circuit of a circuit block in the power semiconductor module shown in FIG. 2.

FIG. 1 is a cross-sectional view of a power semiconductor module according to a first embodiment of the present invention, and FIG. 2 is a top view of the module. This power semiconductor module comprises a plurality of circuit blocks each including a plurality of parallel-connected IGBTs that share common collector, emitter, and gate terminals to achieve high electrical strength and high current operation. For reference, FIG. 3 shows an equivalent circuit of such a circuit block.

Referring to FIGS. 1 and 2, drive circuit substrates 2 (circuit substrates), power semiconductor circuit substrates 3, and junction circuit substrates 13 are mounted on a metal base plate 1 (a heat sink). Each circuit substrate includes an insulating substrate of a ceramic material, etc. and a conductive (or electrode) pattern 10 of copper or aluminum, etc. formed on both sides of the insulating substrate. Power semiconductor devices (chips) 4, such as insulated gate bipolar transistors (IGBTs) 4a and freewheel diodes 4b, are bonded onto the conductive pattern of each power semiconductor circuit substrate 3 by a conductive adhesive member, such as solder. On the other hand, chip resistances 14 are bonded onto the conductive pattern of each drive circuit substrate 2 by a conductive adhesive member such as solder. Electrodes of the power semiconductor devices 4 (namely, the emitter and gate of each IGBT 4a and the anode of each freewheel diode 4b) are electrically connected to their respective drive circuit substrates 2 or junction circuit substrates 13 by wires 5 of Al, etc. More specifically, the emitter electrodes of the IGBTs 4a and the anode electrodes of the freewheel diodes 4b are connected to the conductive pattern 10 of their respective junction circuit substrates 13 by wires 5, while the gate electrodes of the IGBTs 4a are connected to the conductive pattern 10 of their respective drive circuit substrates 2 by wires 5. On each power semiconductor circuit substrate 3, the cathode electrodes of the freewheel diodes 4b are connected to the collector of their respective IGBTs 4a through the conductive pattern 10. A plastic case 7 is provided on the base plate 1 so as to enclose the drive circuit substrates 2, the power semiconductor circuit substrates 3, and the junction circuit substrates 13. A lid 8 is disposed on the top of the case 7. Further, the space within the case 7 is filled with a silicon gel 9 (soft insulator) to make the case 7 airtight and insulate the components inside. Further, each circuit substrate includes an electrode terminal bonding region 15 on which electrode terminals (not shown in the figures) are mounted to allow electrical connection to external devices. It should be noted that although in the above example the power semiconductor circuit substrates 3 and the junction circuit substrates 13 are separately provided, they may be combined into a single insulating substrate that has thereon separate conductive pattern formation regions for power semiconductor circuits and for junction circuits.

Figure 4:
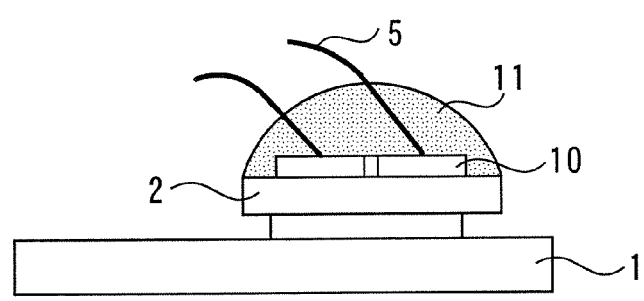
FIG. 4 is an enlarged cross-sectional view of a portion A shown in FIG. 1.

FIG. 4 is an enlarged cross-sectional view of a portion A (i.e., a drive circuit substrate 2) shown in FIG. 1. A conductive pattern 10 formed of a metal such as copper or aluminum is provided on the drive circuit substrate 2. A low dielectric constant film 11 is provided so as to cover the conductive pattern 10. This arrangement reduces partial discharge on the drive circuit substrate 2 having a complicated shape, allowing the operating life of the product to be extended. It should be noted that unlike the drive circuit substrates 2, there is no need to cover the conductive patterns on the power semiconductor circuit substrates 3 and the junction circuit substrates 13. The insulation resistance and the withstand voltage of these circuit substrates can be enhanced by providing a low dielectric constant film 11 on the top surface of each insulating substrate such that it is in contact with the peripheral portion of the conductive pattern, as in conventional arrangements.

It should be noted that the low dielectric constant films 11 may be formed of silicon rubber, polyimide, or epoxy resin. Each material has its advantages. For example, the use of silicon rubber facilitates the assembly, polyimide provides enhanced heat resistance, and epoxy resin provides enhanced heat cycle characteristics.

A brief description will be made of a process of forming a low dielectric constant film 11. In the case of a drive circuit substrate 2, first, chip resistances 14 are bonded at predetermined positions on the conductive pattern on the drive circuit substrate 2 by solder, etc. Then, aluminum wires are connected between the wire bonding positions on the conductive pattern of the drive circuit substrate 2 and the power semiconductor devices 4 (specifically, the gate electrodes of IGBTs 4a) on a power semiconductor circuit substrate 3 (in the same circuit block) by ultrasonic bonding, etc. Then, after bonding electrode terminals to the electrode terminal bonding region 15 of the conductive pattern 10 by solder, etc., a low dielectric constant film 11 is formed so as to cover the conductive pattern 10. On the other hand, in the case of a power semiconductor circuit substrate 3 (and a junction circuit substrate 13), a low dielectric constant film 11 is formed as follows. First, power semiconductor devices 4 are bonded at predetermined positions on the conductor pattern of the power semiconductor circuit substrate 3 by solder, etc. Then, before bonding wires and electrode terminals, a low dielectric constant film 11 is formed on the top surface of the insulating substrate such that it is in contact with the peripheral portion of the conductive pattern.

Second Embodiment

Figure 5:
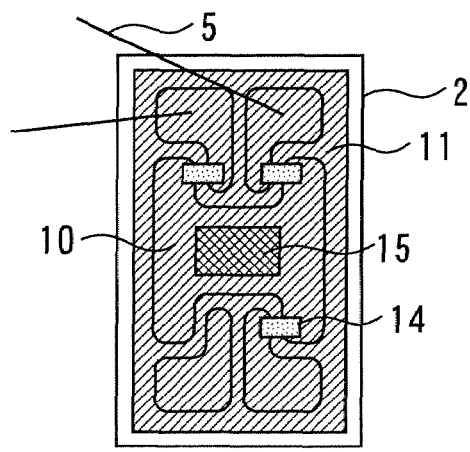
FIG. 5 is a top view of a drive circuit substrate according to a second embodiment of the present invention.

FIG. 5 is a top view of a drive circuit substrate according to a second embodiment of the present invention. According to the second embodiment, the conductive pattern 10 has round corners. All other components are similar to those described in connection with the first embodiment. This embodiment allows further reduction of partial discharge on the drive circuit substrate, resulting in a longer operating life of the product, as compared to the first embodiment.

Third Embodiment

Figure 6:
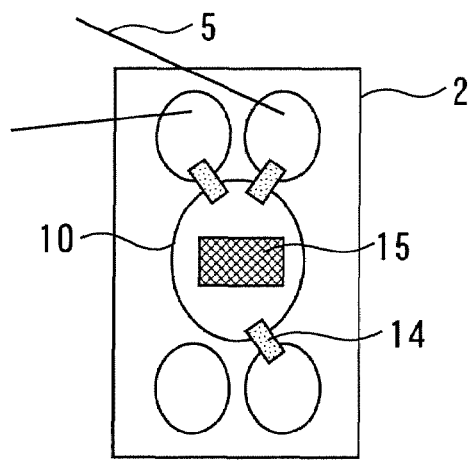
FIG. 6 is a top view of a drive circuit substrate according to a third embodiment of the present invention.

FIG. 6 is a top view of a drive circuit substrate according to a third embodiment of the present invention. According to the third embodiment, the conductive pattern 10 has a round shape and is not covered with a low dielectric constant film 11. All other components are similar to those described in connection with the first embodiment. This embodiment also allows reduction of partial discharge on the drive circuit substrate 2 (which has a complicated shape), resulting in an extended operating life of the product.

Fourth Embodiment

Figure 7:
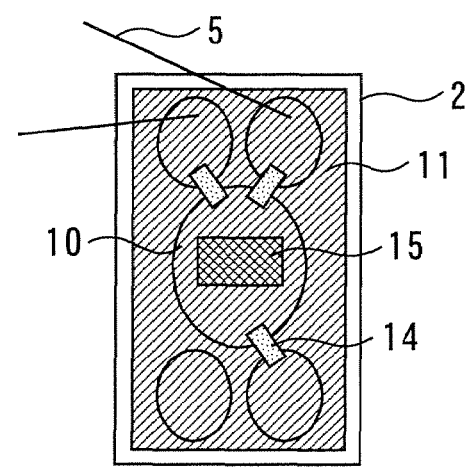
FIG. 7 is a top view of a drive circuit substrate according to a fourth embodiment of the present invention.

FIG. 7 is a top view of a drive circuit substrate according to a fourth embodiment of the present invention. According to the fourth embodiment, the conductive pattern 10 is covered with a low dielectric constant film 11. Except for this feature, the drive circuit substrate is similar to that of the third embodiment. The present embodiment allows further reduction of partial discharge on the drive circuit substrate, resulting in a longer operating life of the product, as compared to the third embodiment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-265178, filed on Sep. 28, 2006 including specification, claims, drawings and summary, on which the Convention priority of the present application is based, are incorporated herein by reference in its entirety.

What is claimed is:

1. A power semiconductor module comprising:
    a heat sink;
    a power semiconductor mounted to said heat sink;
    a driver unit mounted to said heat sink and configured to deliver turn-on and turn-off signals for the power semiconductor, the driver unit comprising,
        a circuit substrate,
        a conductive pattern provided on the circuit substrate,
        a chip resistance for the power semiconductor connected to said conductive pattern, and
        a low dielectric constant film covering at least one of the conductive pattern and the chip resistance;
    a case provided on the heat sink so as to enclose the power semiconductor and the driver unit; and
    a lid disposed on a top portion of the case,
    wherein the power semiconductor is not covered by said low dielectric constant film.

2. The power semiconductor module as claimed in claim 1, wherein the low dielectric constant film is formed of silicon rubber, polyimide, or epoxy resin.

3. The power semiconductor module as claimed in claim 1, wherein the conductive pattern of the driver unit includes a planar pattern of circular shape.

4. The power semiconductor module as claimed in claim 1, wherein the conductive pattern of the driver unit includes:
    a first pattern including a terminal bonding region configured to interconnect the driver unit to an external device; and
    a second pattern including a terminal configured to interconnect the second pattern with the power semiconductor,
    wherein the chip resistance electrically connects the first pattern with the second pattern.

5. The power semiconductor module as claimed in claim 4, wherein the first and second patterns are planar patterns of a circular shape.

6. The power semiconductor module as claimed in claim 1, further comprising:
    an insulator filling an interior space formed by the case.

7. A power semiconductor module comprising:
    a heatsink;
    a power semiconductor mounted to said heat sink;
    a driver unit mounted to said heat sink and configured to deliver turn-on and turn-off signals for the power semiconductor, the driver unit comprising,
        a circuit substrate,
        a conductive pattern provided on the circuit substrate,
        a chip resistance for the power semiconductor connected to said conductive pattern, and
        a low dielectric constant film covering at least one of the conductive pattern and the chip resistance;

a case provided on the heat sink so as to enclose the power semiconductor and the driver unit; and a lid disposed on a top portion of the case, wherein the conductive pattern of the driver unit includes, a first pattern including a terminal bonding region configured to interconnect the driver unit to an external device; and a second pattern including a terminal configured to interconnect the second pattern with the power semiconductor, wherein the chip resistance electrically connects the first pattern with the second pattern, and wherein the first pattern and the terminal bonding region are arranged substantially in a center of the driver unit.

8. A power semiconductor module comprising:

a heat sink;

a power semiconductor mounted to said heat sink;

a driver unit mounted to said heat sink and configured to deliver turn-on and turn-off signals for the power semiconductor, the driver unit comprising, a circuit substrate, a conductive pattern provided on the circuit substrate, a chip resistance for the power semiconductor connected to said conductive pattern, and a low dielectric constant film covering at least one of the conductive pattern and the chip resistance;

a case provided on the heat sink so as to enclose the power semiconductor and the driver unit;

a lid disposed on a top portion of the case; and a plurality of power semiconductors, wherein the driver unit further includes:

a first pattern including a terminal bonding region configured to interconnect the driver unit to an external device;

a plurality of second patterns each having a terminal, each terminal configured to interconnect the terminal with one of the plurality of power semiconductors; and a plurality of chip resistance configured to electrically connect the first pattern with the plurality of second patterns, wherein one turn-on/turn-off signal applied to the terminal bonding region of the first pattern is configured to turn-on/turn-off the plurality of power semiconductors, wherein the first pattern and the terminal bonding region are arranged substantially in a center of the driver unit.

9. A power semiconductor module comprising:

a heat sink;

a power semiconductor mounted to said heat sink;

a driver unit mounted to said heat sink and configured to deliver turn-on and turn-off signals for the power semiconductor, the driver unit comprising, a circuit substrate, a conductive pattern provided on the circuit substrate, the conductive pattern including a first pattern including a terminal bonding region configured to interconnect the driver unit to an external device and a second pattern including a terminal configured to interconnect the second pattern with the power semiconductor, and a chip resistance electrically connecting the first pattern with the second pattern;

a case provided on the heat sink so as to enclose the power semiconductor and the driver unit; and a lid disposed on a top portion of the case, wherein the first pattern and the terminal bonding region are arranged substantially in a center of the driver unit.

10. The power semiconductor module as claimed in claim 9, further comprising:

an insulator filling an interior space formed by the case.

* * * * *